(12) United States Patent
Imanishi et al.

(10) Patent No.: US 8,724,357 B2
(45) Date of Patent: May 13, 2014

(54) POWER SEMICONDUCTOR DEVICE INCLUDING A BOOTSTRAP COMPENSATION CIRCUIT

(75) Inventors: Motoki Imanishi, Fukuoka (JP); Kenji Sakai, Fukuoka (JP); Yoshikazu Tanaka, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 526 days.

(21) Appl. No.: 13/010,178

(22) Filed: Jan. 20, 2011

(65) Prior Publication Data

US 2011/0260707 A1 Oct. 27, 2011

(30) Foreign Application Priority Data

Apr. 23, 2010 (JP) ................................. 2010-099788

(51) Int. Cl.
*H02M 7/5387* (2007.01)
*H02M 1/084* (2006.01)

(52) U.S. Cl.
USPC ................ 363/132; 323/271; 363/60; 363/98

(58) Field of Classification Search
USPC ......... 323/271, 282, 284; 363/17, 60, 97, 131
See application file for complete search history.

(56) References Cited

U.S. PATENT DOCUMENTS

| | | | |
|---|---|---|---|
| 5,408,150 A | 4/1995 | Wilcox | |
| 5,627,460 A * | 5/1997 | Bazinet et al. | 323/288 |
| 6,801,063 B1 * | 10/2004 | Guo | 327/108 |
| 7,468,622 B2 * | 12/2008 | Bodano et al. | 327/390 |
| 2002/0036487 A1 * | 3/2002 | Moriconi et al. | 323/288 |
| 2003/0156439 A1 | 8/2003 | Ohmichi et al. | |
| 2005/0168206 A1 | 8/2005 | Nadd | |
| 2009/0285005 A1 * | 11/2009 | Gopfrich | 363/132 |

(Continued)

FOREIGN PATENT DOCUMENTS

| | | |
|---|---|---|
| DE | 102 57 453 A1 | 9/2003 |
| JP | 59-99805 | 6/1984 |

(Continued)

OTHER PUBLICATIONS

Office Action issued Jul. 31, 2012 in German Patent Application No. 10 2011 007 220.9 with English language translation.
Office Action issued Aug. 6, 2013 in Japanese Patent Application No. 2010-099788 (with partial English translation).

*Primary Examiner* — Matthew Nguyen
*Assistant Examiner* — Fred E Finch, III
(74) *Attorney, Agent, or Firm* — Oblon, Spivak, McClelland, Maier & Neustadt, L.L.P.

(57) ABSTRACT

A power semiconductor device comprises: high side and low side switching elements; high side and low side drive circuits; a bootstrap capacitor supplying a drive voltage to the high side drive circuit and having a first terminal connected to a connection point between the high side switching element and the low side switching element and a second terminal connected to a power supply terminal of the high side drive circuit; a bootstrap diode having an anode connected to a power supply and a cathode connected to the second terminal and supplying a current from the power supply to the second terminal; a floating power supply; and a bootstrap compensation circuit supplying a current from the floating power supply to the second terminal, when the high side drive circuit turns ON the high side switching element and the low side drive circuit turns OFF the low side switching element.

7 Claims, 8 Drawing Sheets

(56) References Cited

U.S. PATENT DOCUMENTS

| | | | |
|---|---|---|---|
| 2010/0124085 A1* | 5/2010 | Zeng et al. | 363/101 |
| 2010/0134091 A1* | 6/2010 | Eom et al. | 324/76.11 |
| 2010/0202163 A1* | 8/2010 | Yang et al. | 363/21.12 |
| 2010/0289560 A1* | 11/2010 | Mavencamp et al. | 327/538 |
| 2011/0075452 A1* | 3/2011 | Santoro et al. | 363/56.1 |
| 2011/0148368 A1* | 6/2011 | Burns et al. | 323/225 |

FOREIGN PATENT DOCUMENTS

| | | |
|---|---|---|
| JP | 7-154144 | 6/1995 |
| JP | 2003-23323 | 1/2003 |
| JP | 2003-133924 | 5/2003 |
| JP | 2006-528480 | 12/2006 |
| JP | 2007-520190 | 7/2007 |
| JP | 2007-215389 | 8/2007 |
| JP | 2009-60750 | 3/2009 |

* cited by examiner

POWER SEMICONDUCTOR DEVICE INCLUDING A BOOTSTRAP COMPENSATION CIRCUIT

BACKGROUND OF THE INVENTION

1. Field of the Invention

The present invention relates to a power semiconductor device provided with a drive circuit that drives a totem-pole connected high side switching element and low side switching element, and more particularly, to a power semiconductor device capable of sufficiently charging a bootstrap capacitor, and simplifying and downsizing the circuit.

2. Background Art

A high side drive circuit that drives a high side switching element requires a drive voltage higher than a main power supply. It is therefore a known practice that the drive voltage is obtained by charging the bootstrap capacitor from a low side drive power supply. However, when the high side switching element is ON, a potential at one end of the bootstrap capacitor increases and the other end of the bootstrap capacitor cannot be charged. Therefore, there is a problem that the bootstrap capacitor cannot be sufficiently charged if the high side switching element keeps ON.

To solve this problem, a power semiconductor device provided with a refresh circuit for a bootstrap capacitor is proposed (e.g., see FIG. 2 of National Publication of International Patent Application No. 2007-520190). The refresh circuit secures a charge channel by selecting a switch SW1 or SW2 and thereby setting a potential at one end of the bootstrap capacitor to GND irrespective of the ON/OFF state of the high side switching element.

SUMMARY OF THE INVENTION

The switches SW1 and SW2 of the refresh circuit of National Publication of International Patent Application No. 2007-520190 need to be high voltage elements. Furthermore, signals that drive the switches SW1 and SW2 need to be transmitted from the low voltage side to the high voltage side and from the high voltage side to low voltage side. That is, a level shift or inverse level shift needs to be used. Thus, there is a problem that the circuit becomes complicated and increases in size.

In view of the above-described problems, an object of the present invention is to provide a power semiconductor device capable of sufficiently charging a bootstrap capacitor, and simplifying and downsizing the circuit.

According to the present invention, a power semiconductor device comprises: a high side switching element and a low side switching element which are totem-pole-connected in that order from the high voltage side between a high voltage side potential and a low voltage side potential; a high side drive circuit that drives the high side switching element; a low side drive circuit that drives the low side switching element; a bootstrap capacitor having first and second terminals and supplying a drive voltage to the high side drive circuit, the first terminal connected to a connection point between the high side switching element and the low side switching element, the second terminal connected to a power supply terminal of the high side drive circuit; a bootstrap diode having an anode connected to a power supply and a cathode connected to the second terminal of the bootstrap capacitor and supplying a current from the power supply to the second terminal of the bootstrap capacitor; a floating power supply using the high voltage side potential as a reference potential; and a bootstrap compensation circuit supplying a current from the floating power supply to the second terminal of the bootstrap capacitor, when the high side drive circuit turns ON the high side switching element and the low side drive circuit turns OFF the low side switching element.

The present invention makes it possible to provide a power semiconductor device capable of sufficiently charging a bootstrap capacitor, and simplifying and downsizing the circuit.

Other and further objects, features and advantages of the invention will appear more fully from the following description.

DETAILED DESCRIPTION OF THE PREFERRED EMBODIMENTS

A power semiconductor device according to the embodiments of the present invention will be described with reference to the drawings. The same components will be denoted by the same symbols, and the repeated description thereof may be omitted.

First Embodiment

Figure 1:
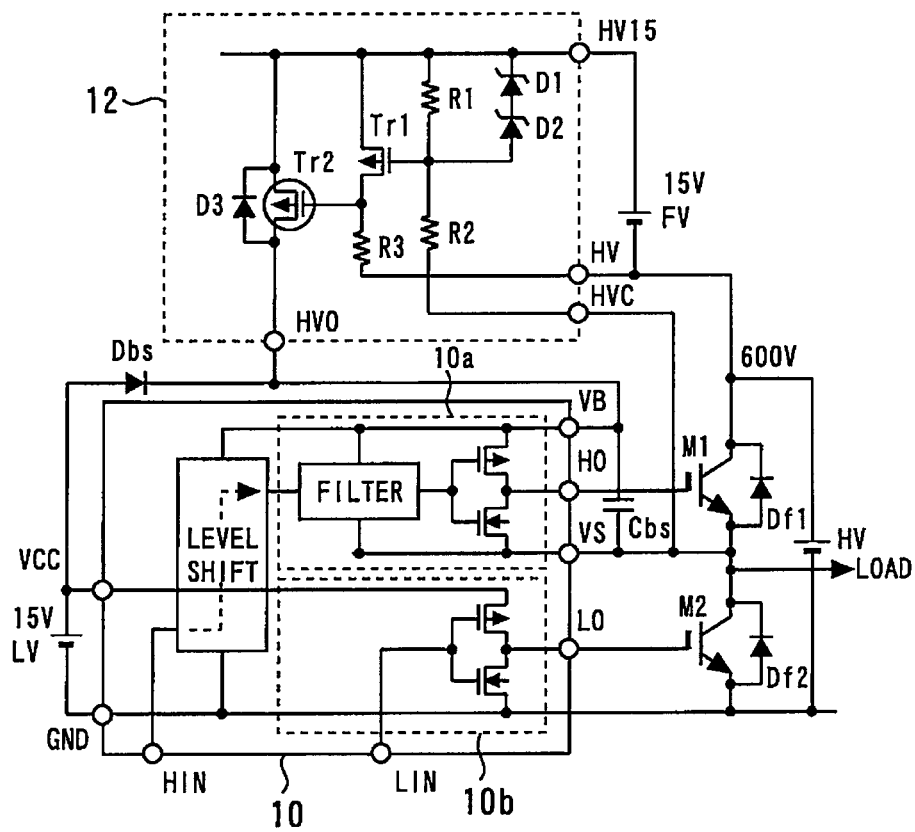
FIG. 1 is a circuit diagram illustrating a power semiconductor device according to a first embodiment.

FIG. 1 is a circuit diagram illustrating a power semiconductor device according to a first embodiment. A high side switching element M1 and a low side switching element M2 are totem-pole-connected in that order from the high voltage side between a high voltage side potential (600 V) and a low voltage side potential (0 V) of a main power supply HV. The high side switching element M1 and the low side switching element M2 are N-type semiconductor switching elements. Reflux diodes Df1 and Df2 are anti-parallel connected to the high side switching element M1 and the low side switching element M2 respectively.

A drive circuit 10 includes a high side drive circuit 10a that drives the high side switching element M1 and a low side drive circuit 10b that drives the low side switching element M2. A VB terminal of the drive circuit 10 is a power supply terminal of the high side drive circuit 10a. A VCC terminal is a power supply terminal of the low side drive circuit 10b and is connected to a low side drive power supply LV. A GND terminal is connected to GND (grounding point). A signal that controls the high side drive circuit 10a is inputted from an HIN terminal and a signal that controls the low side drive circuit 10b is inputted from an LIN terminal. An ON/OFF command is outputted from an HO terminal for the high side switching element M1 of the high side drive circuit 10a and an ON/OFF command is outputted from an LO terminal for the low side switching element M2 of the low side drive circuit 10b. A VS terminal is connected to a connection point between the high side switching element M1 and the low side switching element M2.

Here, the potential (VS potential) of the emitter (VS terminal) of the high side switching element M1 varies between a GND potential (0 V) and a high voltage side potential of the main power supply HV depending on the ON/OFF state of the low side switching element M2 and reflux of a current that flows through a load or the like. For this reason, the high side drive circuit 10a operates using the VS potential as a reference and has a potentially floating structure (insulated) with respect to GND. Such a structure is realized by a PN junction isolation structure or SOI (semiconductor-on-insulator) structure.

Furthermore, in order to drive the high side switching element M1, a higher potential than the emitter needs to be applied to the gate thereof. When the high side switching element M1 is ON, the emitter potential (VS potential) is substantially equal to the high voltage side potential of the main power supply HV. Therefore, the high voltage side potential 600 V+gate drive voltage 15 V=615 V needs to be applied to the gate so as to keep ON the high side switching element M1. Thus, the operating voltage of the high side drive circuit 10a needs to be higher than the potential of the main power supply HV.

Thus, a bootstrap capacitor Cbs and a bootstrap diode Dbs are provided. One end of the bootstrap capacitor Cbs is connected to the VS terminal and the other end is connected to the VB terminal. The bootstrap capacitor Cbs supplies a drive voltage to the high side drive circuit 10a via the VB terminal. The anode of the bootstrap diode Dbs is connected to the low side drive power supply LV of 15 V and the cathode is connected to the other end of the bootstrap capacitor Cbs. The bootstrap diode Dbs supplies a current from the low side drive power supply LV to the other end of the bootstrap capacitor Cbs and charges the bootstrap capacitor Cbs. By adding the charge voltage to the emitter potential (VS potential) of the high side switching element M1, it is possible to obtain an operating voltage of the high side drive circuit 10a.

The present embodiment is further provided with a floating power supply FV and a bootstrap compensation circuit 12. The floating power supply FV of 15 V uses the high voltage side potential of the main power supply HV as a reference potential. An HV terminal of the bootstrap compensation circuit 12 is connected to the high voltage side of the main power supply HV. An HV15 terminal is connected to the high voltage side of the floating power supply FV and the potential thereof is 600 V+15 V=615 V. An HVO terminal, which is an output terminal of the bootstrap compensation circuit 12, is connected to the other end of the bootstrap capacitor Cbs.

In the first embodiment, an HVC terminal, which is an input terminal of the bootstrap compensation circuit 12, is connected to a connection point (VS terminal) between the high side switching element M1 and the low side switching element M2 of the drive circuit 10. Thus, the bootstrap compensation circuit 12 monitors the VS potential and supplies, when the VS potential is greater than a predetermined value, a current from the floating power supply FV to the other end of the bootstrap capacitor Cbs.

In the bootstrap compensation circuit 12, a control transistor Tr1 is a PMOS (p-type Metal Oxide Semiconductor) transistor and a main transistor Tr2 is a high voltage HVPMOS (High Voltage p-type Metal Oxide Semiconductor) transistor. The gate of the control transistor Tr1 is connected to a connection point between resistors R1 and R2 connected in series between the HV15 terminal and the HV terminal. The drain of the control transistor Tr1 is connected to the HV terminal via a resistor R3.

The control transistor Tr1 turns ON or OFF according to the potential (VS potential in the present embodiment) of the HVC terminal. The main transistor Tr2 supplies a current from the HVO terminal under the control of the control transistor Tr1. When the main transistor Tr2 does not supply any current, the control transistor Tr1 needs to turn ON, and therefore the gate voltage of the control transistor Tr1 is clamped by Zener diodes D1 and D2. A parasitic diode D3 (high voltage RESURF diode) is anti-parallel connected to the main transistor Tr2.

A potential Va at a connection point between the resistor R1 and the resistor R2 is expressed by the following equation.

$$Va = R2/(R1+R2) \times (HV15 - VS) + VS$$

where R1 and R2 are resistance values of the resistors R1 and R2, HV15 is the potential of the HV15 terminal (HV15 potential) and VS is the potential of the VS terminal (VS potential). Furthermore, a source-gate voltage VGS1 of the control transistor Tr1 is expressed by the following equation.

$$VGS1 = HV15 - Va = R1/(R1+R2) \times (HV15 \times VS).$$

where the HV15 potential is 615 V and a threshold voltage of the control transistor Tr1 is 1.0 V. When, for example, R1 is set to 500 kΩ and R2 is set to 1 MΩ, VGS1 is 29.3 V when the VS potential is LOW (0 V) and the control transistor Tr1 turns ON. On the other hand, when the VS potential is HIGH (600 V), VGS1 is 0.71 V and the control transistor Tr1 turns OFF.

Thus, the first embodiment sets the resistance values of the resistors R1 and R2 so that the control transistor Tr1 turns ON when the VS potential is LOW and the control transistor Tr1 turns OFF when the VS potential is HIGH. However, since a high voltage is applied between the HV15 terminal and the HVC terminal, high voltage resistors are used as the resistors R1 and R2.

Figure 2:
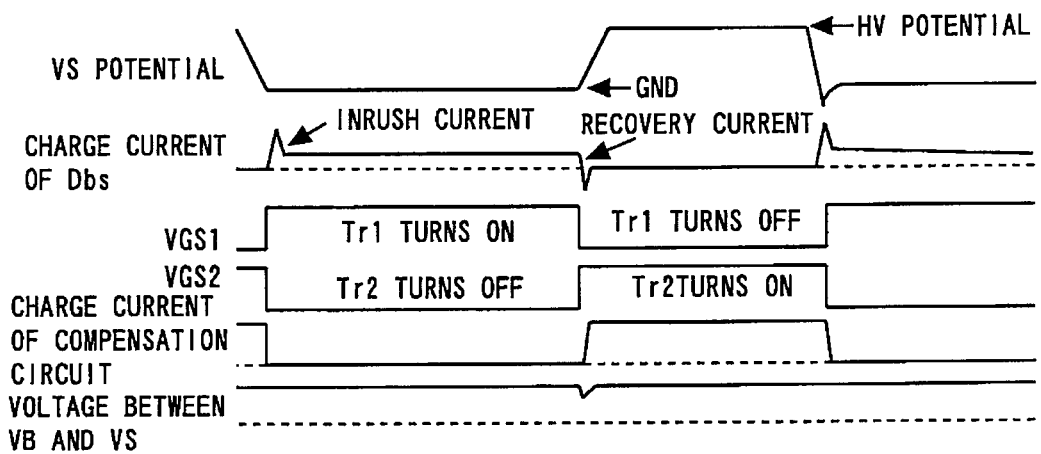
FIG. 2 is a timing chart illustrating the operation of the power semiconductor device according to the first embodiment.

FIG. 2 is a timing chart illustrating the operation of the power semiconductor device according to the first embodiment. In FIG. 2, the VS potential is the potential of the VS terminal and VGS1 is a source-gate voltage of the control transistor Tr1 and VGS2 is a source-gate voltage of the main transistor Tr2.

When the high side drive circuit 10a turns OFF the high side switching element M1 and the low side drive circuit 10b turns ON the low side switching element M2, the VS potential becomes a GND potential. In this case, since the bootstrap diode Dbs is forward-biased, a charge current of the bootstrap diode Dbs flows. On the other hand, since the control transistor Tr1 of the bootstrap compensation circuit 12 turns ON and the main transistor Tr2 turns OFF, the bootstrap compensation circuit 12 does not supply any charge current.

Here, when the VS potential is the GND potential, the potential difference between the HV15 terminal and the VS terminal becomes a maximum. In this case, if the main transistor Tr2 turns ON, power consumption increases, and therefore the main transistor Tr2 needs to have been turned OFF. Furthermore, since a high voltage is applied between the HV terminal and the HVO terminal connected to the main power supply HV which is always a high potential, a continued current supply of by the main transistor Tr2 may increase heat loss and cause the main transistor Tr2 to suffer thermal destruction. Therefore, when the VS potential is the GND potential, the main transistor Tr2 is turned OFF.

Furthermore, when the high side drive circuit 10a turns ON the high side switching element M1 and the low side drive circuit 10b turns OFF the low side switching element M2, the VS potential increases up to the HV potential. In this case, the bootstrap diode Dbs is reverse-biased, and therefore the charge current of the bootstrap diode Dbs does not flow. On the other hand, since the Tr1 of the bootstrap compensation circuit 12 turns OFF and the main transistor Tr2 turns ON, the bootstrap compensation circuit 12 supplies the charge current from the floating power supply FV to the other end of the bootstrap capacitor Cbs.

When the load is an inductive load such as motor or the like, even when the low side switching element M2 turns OFF, the load will try to continue to pass the current that flowed through the load itself immediately before. Therefore, while the low side switching element M2 is OFF and the high side switching element M1 is not ON yet, the current from the load flows through the high voltage side of the main power supply HV via the reflux diode Df1 (reflux mode). In this case, the VS potential becomes HV potential+Vf2. Here, Vf2 is a potential difference between the cathode and anode of the reflux diode Df1. In the first embodiment, the bootstrap compensation circuit 12 supplies a charge current even in such a reflux mode.

As described so far, since the bootstrap compensation circuit 12 operates when the bootstrap diode Dbs cannot operate, the voltage between the VB terminal and the VS terminal becomes substantially constant irrespective of a variation in the VS potential. Therefore, the bootstrap capacitor Cbs can be charged sufficiently. Therefore, even when the high side switching element M1 keeps ON, the drive voltage of the high side drive circuit 10a can be secured. Furthermore, the circuit can be simplified and downsized compared to conventional circuits.

Furthermore, since the bootstrap compensation circuit 12 monitors the VS potential in the present embodiment, the monitor HVC terminal and the output HVO terminal of the bootstrap compensation circuit 12 can be unified into one common terminal. Therefore, there is also an advantage that the apparatus can be downsized.

Second Embodiment

Figure 3:
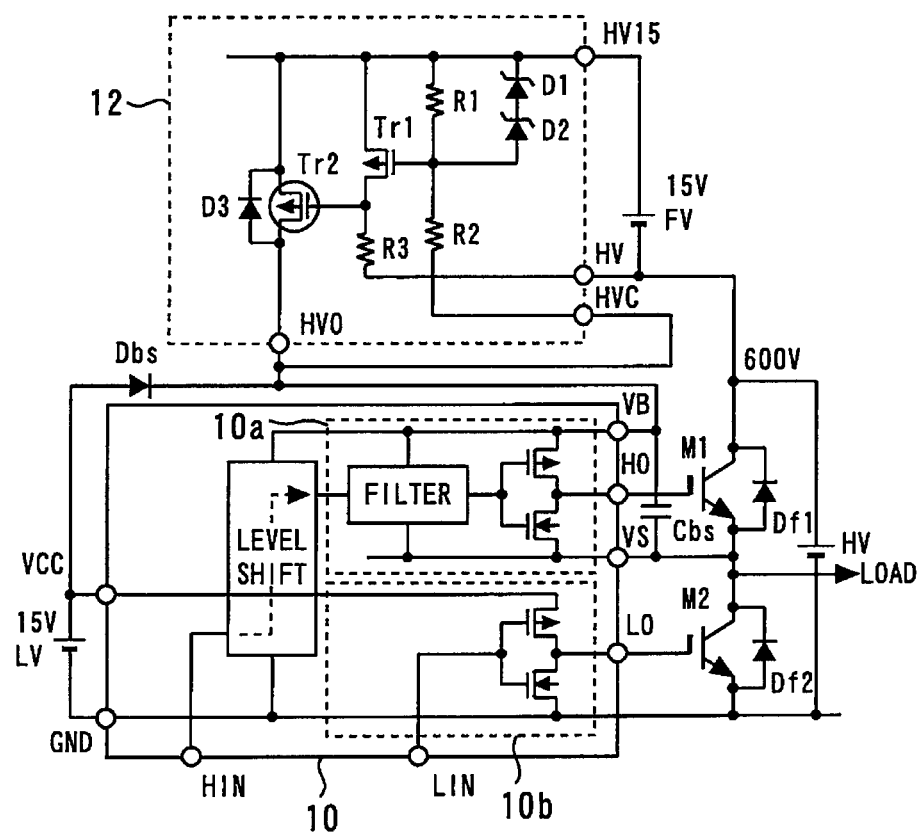
FIG. 3 is a circuit diagram illustrating a power semiconductor device according to a second embodiment.

FIG. 3 is a circuit diagram illustrating a power semiconductor device according to a second embodiment. In the second embodiment, unlike the first embodiment, the other end (VB terminal) of the bootstrap capacitor Cbs is connected to the HVC terminal of the bootstrap compensation circuit 12. The bootstrap compensation circuit 12 monitors the VB potential at the other end of the bootstrap capacitor Cbs and supplies, when the VB potential is greater than a predetermined value, a current from the floating power supply FV to the other end of the bootstrap capacitor Cbs. This allows effects similar to those of the first embodiment to be obtained.

Furthermore, since the bootstrap compensation circuit 12 monitors the VB potential, the monitor HVC terminal and the output HVO terminal of the bootstrap compensation circuit 12 can be unified into one common terminal. Therefore, the apparatus can be further downsized compared to the first embodiment. However, since the VB potential depends on the charge voltage of the bootstrap capacitor Cbs, when, for example, the charge voltage is low, timing at which the bootstrap compensation circuit 12 turns ON is delayed. On the other hand, in the first embodiment that monitors the VS potential, the timing at which the bootstrap compensation circuit 12 turns ON does not depend on the charge voltage.

Third Embodiment

Figure 4:
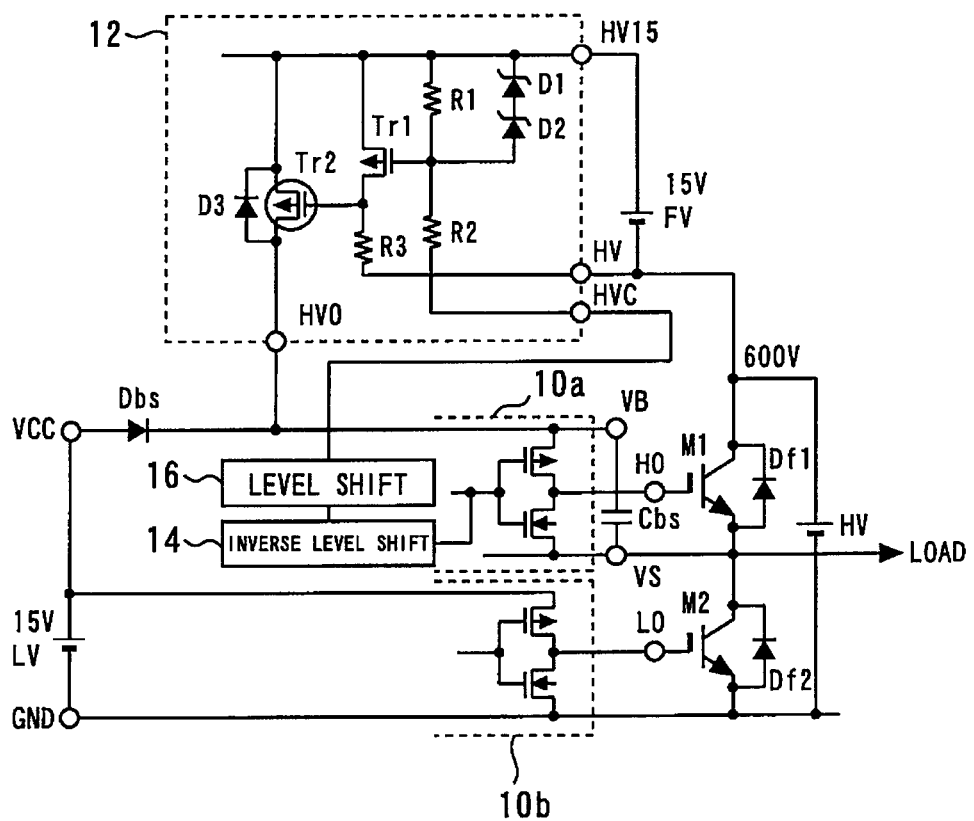
FIG. 4 is a circuit diagram illustrating a power semiconductor device according to a third embodiment.

FIG. 4 is a circuit diagram illustrating a power semiconductor device according to a third embodiment. In the third embodiment, unlike the first embodiment, the high side drive circuit 10a is connected to the HVC terminal of the bootstrap compensation circuit 12 via a reverse level shift circuit 14 and a level shift circuit 16.

Here, since the signal in the high side drive circuit 10a uses the potential of the VS terminal (VS potential) as a reference, the absolute value fluctuates from 0 V to 600+15 V due to a fluctuation in the VS potential. On the other hand, the signal in the bootstrap compensation circuit 12 uses the potential in the HV terminal (HV potential) as a reference. Thus, the signal in the high side drive circuit 10a is level-shifted to a GND reference by the reverse level shift circuit 14 and further the output of the reverse level shift circuit 14 is level-shifted to the HV potential reference by the level shift circuit 16 and then inputted to the HVC terminal of the bootstrap compensation circuit 12.

The bootstrap compensation circuit 12 of the present embodiment monitors an ON/OFF command for the high side switching element M1 of the high side drive circuit 10a and supplies, when this command is an ON command (when the potential of the HO terminal is HIGH (HV+15 V)), a current from the floating power supply FV to the other end of the bootstrap capacitor Cbs. This allows effects similar to those of the first embodiment to be obtained.

In the third embodiment, unlike the first embodiment, no charge current of the bootstrap compensation circuit 12 flows in the reflux mode. When the bootstrap compensation circuit 12 turns ON too early, this can prevent the charge voltage of the bootstrap capacitor Cbs from becoming too high.

Fourth Embodiment

Figure 5:
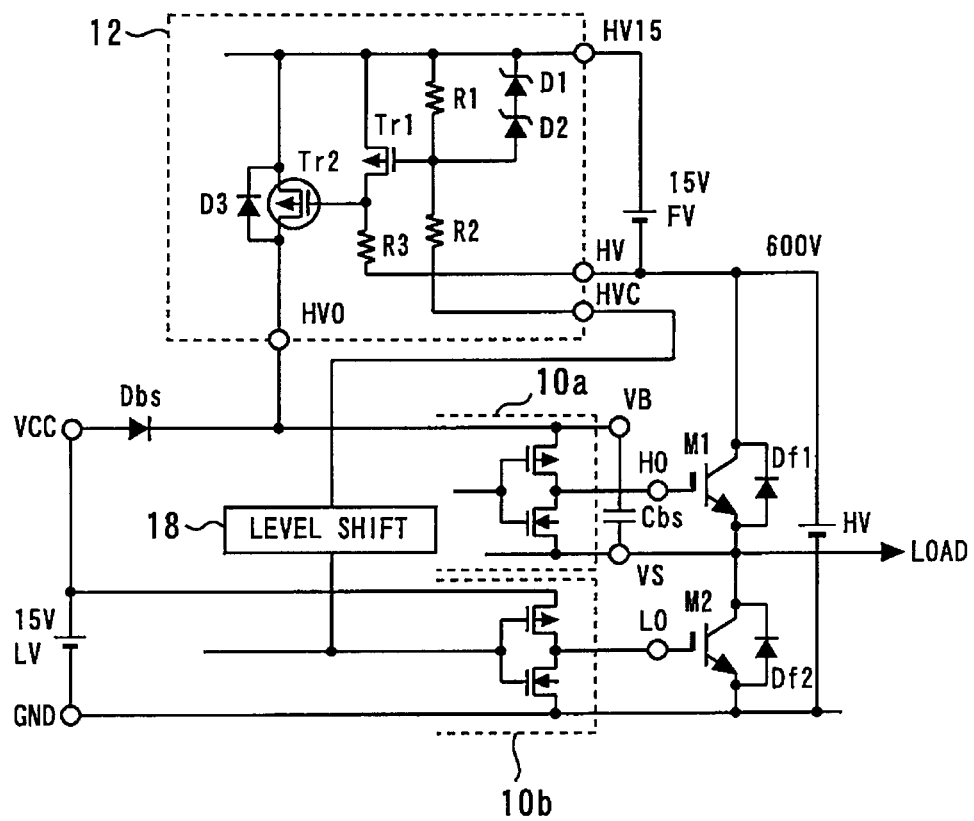
FIG. 5 is a circuit diagram illustrating a power semiconductor device according to a fourth embodiment.

FIG. 5 is a circuit diagram illustrating a power semiconductor device according to a fourth embodiment. In the fourth embodiment, unlike the first embodiment, the low side drive circuit 10b is connected to the HVC terminal of the bootstrap compensation circuit 12 via a level shift circuit 18. A signal of the low side drive circuit 10b is level-shifted to an HV potential reference by the level shift circuit 18 and then inputted to the HVC terminal of the bootstrap compensation circuit 12.

The bootstrap compensation circuit 12 of the present embodiment monitors an ON/OFF command on the low side switching element M2 of the low side drive circuit 10b and supplies, when this command is an OFF command (the potential of the LO terminal is LOW), a current from the floating power supply FV to the other end of the bootstrap capacitor Cbs. This allows effects similar to those of the first embodiment to be obtained.

Fifth Embodiment

Figure 6:
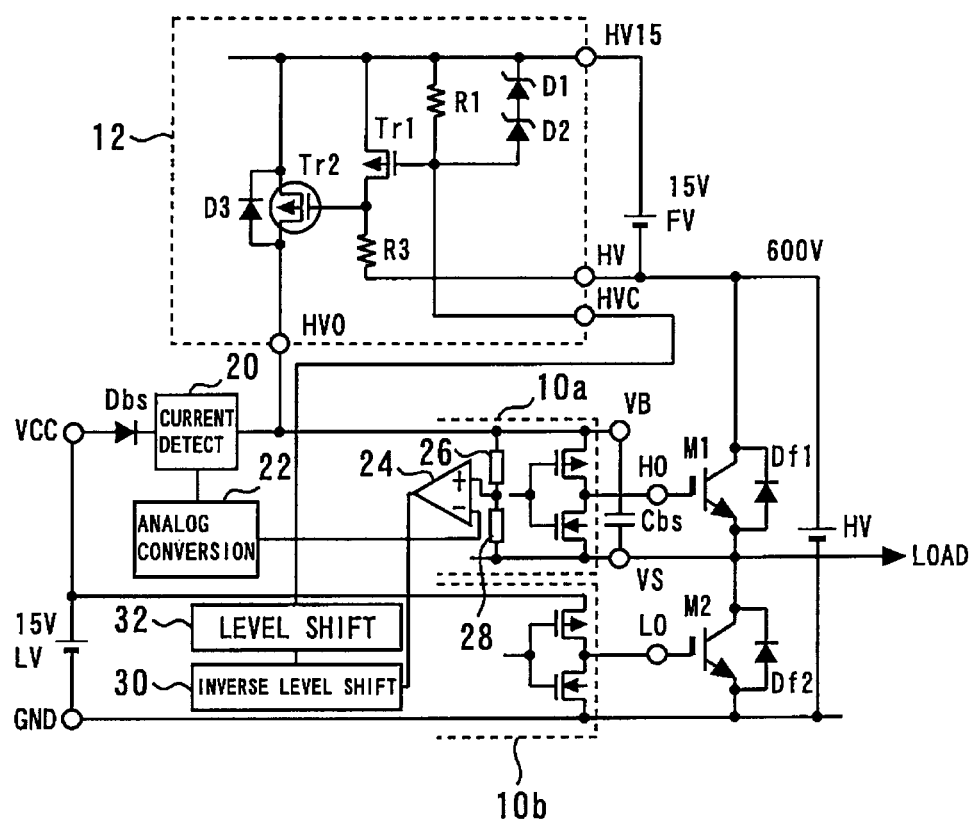
FIG. 6 is a circuit diagram illustrating a power semiconductor device according to a fifth embodiment.

FIG. 6 is a circuit diagram illustrating a power semiconductor device according to a fifth embodiment. A current measuring section 20 is provided which detects a current that flows from the low side drive power supply LV to the other end of the bootstrap capacitor Cbs through the bootstrap diode Dbs. The output of the current measuring section 20 is converted to an analog signal by an analog conversion circuit 22 and inputted to a − terminal of a comparator 24. A + terminal of the comparator 24 is connected to a connection point between resistors 26 and 28 connected in series between the VB terminal and the VS terminal.

Here, the output (digital value) of the comparator 24 uses the VS potential as a reference. On the other hand, the signal in the bootstrap compensation circuit 12 uses the HV potential as a reference. Thus, the output of the comparator 24 is level-shifted to a GND reference by a reverse level shift circuit 30 and further the output of the reverse level-shifted circuit 30 is level-shifted to the HV potential reference by a level-shift circuit 32 and then inputted to the HVC terminal of the bootstrap compensation circuit 12.

When the current measured by the current measuring section 20 is smaller than a predetermined value, the bootstrap compensation circuit 12 of the present embodiment supplies a current from the floating power supply FV to the other end of the bootstrap capacitor Cbs. Therefore, the bootstrap diode Dbs is reverse-biased, and it is possible to detect a state in which no current can be supplied to the bootstrap capacitor Cbs and the bootstrap compensation circuit 12 can supply a current to the bootstrap capacitor Cbs. This allows effects similar to those of the first embodiment to be obtained. Furthermore, the current supply to the bootstrap capacitor Cbs can be kept constant.

Sixth Embodiment

Figure 7:
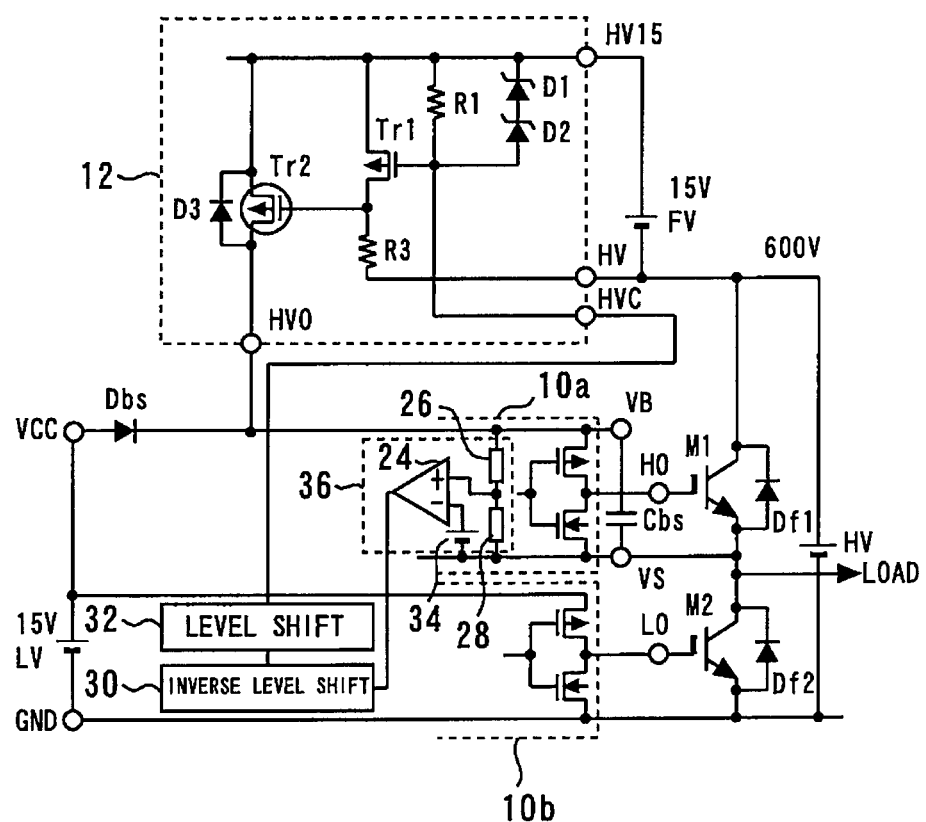
FIG. 7 is a circuit diagram illustrating a power semiconductor device according to a sixth embodiment.

FIG. 7 is a circuit diagram illustrating a power semiconductor device according to a sixth embodiment. In the sixth embodiment, unlike the fifth embodiment, there is neither current measuring section 20 nor analog conversion circuit 22, the high voltage side of a power supply 34 is connected to a − terminal of the comparator 24 and the low voltage side of the power supply 34 is connected to the VS terminal.

The comparator 24, power supply 34 and resistors 26 and 28 make up a potential difference measuring section 36 that measures a potential difference at both ends of the bootstrap capacitor Cbs (potential difference between the VB terminal and VS terminal).

When the potential difference measured by the potential difference measuring section 36 is smaller than a predetermined value, the bootstrap compensation circuit 12 supplies a current from the floating power supply FV to the other end of the bootstrap capacitor Cbs. On the other hand, when the potential difference is greater than the predetermined value and charging is not necessary, the current supply from the floating power supply FV is stopped. This allows effects similar to those of the first embodiment to be obtained. Furthermore, the current supply to the bootstrap capacitor Cbs can be kept constant.

Seventh Embodiment

Figure 8:
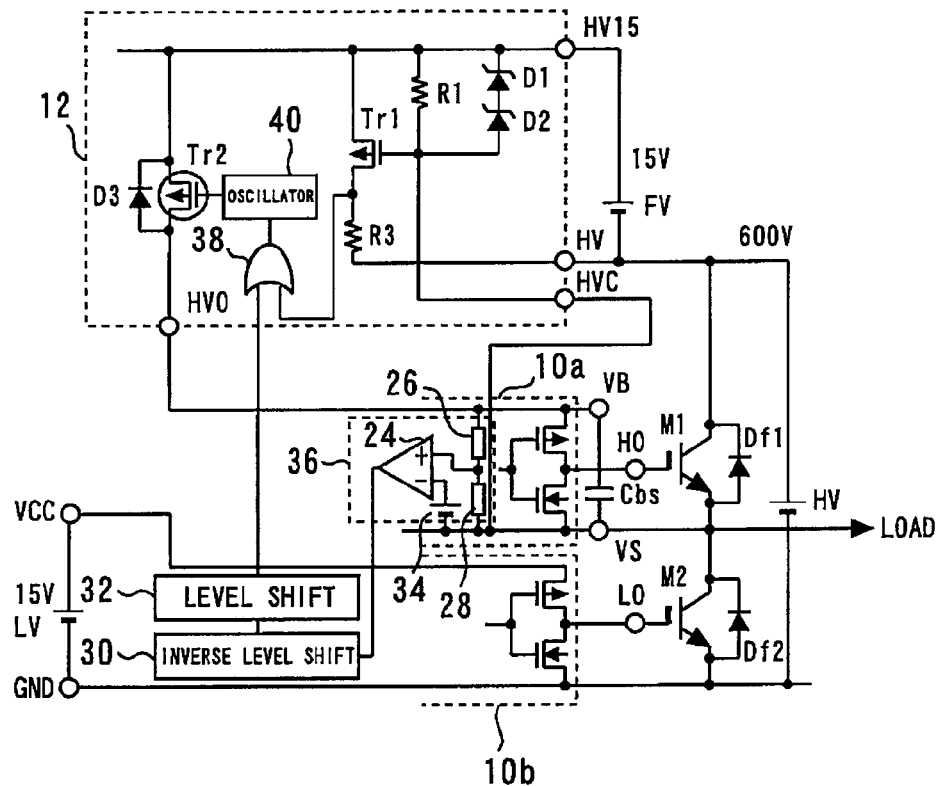
FIG. 8 is a circuit diagram illustrating a power semiconductor device according to a seventh embodiment.

FIG. 8 is a circuit diagram illustrating a power semiconductor device according to a seventh embodiment. Unlike the sixth embodiment, the seventh embodiment is provided with no bootstrap diode Dbs. The bootstrap compensation circuit 12 is further provided with an AND circuit 38 that performs an AND operation between the output of the potential difference measuring section 36 and the output of the control transistor Tr1 and an oscillator 40 that operates according to the output of the AND circuit 38.

Figure 9:
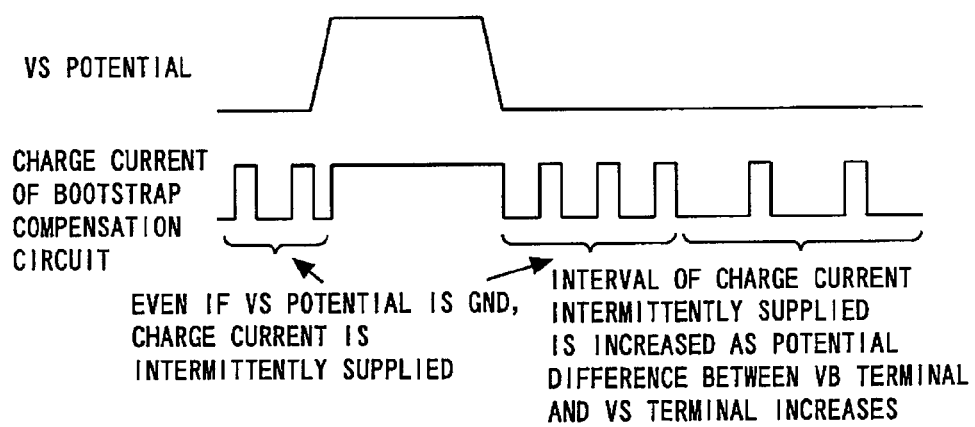
FIG. 9 is a timing chart illustrating the operation of the power semiconductor device according to the seventh embodiment.

FIG. 9 is a timing chart illustrating the operation of the power semiconductor device according to the seventh embodiment. When the high side drive circuit 10a turns ON the high side switching element M1 and the low side drive circuit 10b turns OFF the low side switching element M2, the VS terminal becomes a high potential. In this case, in the same way as in the first to sixth embodiments, the bootstrap compensation circuit 12 of the present embodiment continuously supplies a current from the floating power supply FV to the other end of the bootstrap capacitor Cbs.

When the high side drive circuit 10a turns OFF the high side switching element M1 and the low side drive circuit 10b turns ON the low side switching element M2, the VS terminal is set to GND. In this case, in the first to sixth embodiments, the bootstrap diode Dbs supplies the charge current and the bootstrap compensation circuit 12 stops the supply of the charge current. On the other hand, the bootstrap compensation circuit 12 of the present embodiment supplies the charge current intermittently in this case, too. Therefore, the present embodiment can omit the bootstrap diode Dbs of the first to sixth embodiments.

Furthermore, the bootstrap compensation circuit 12 increases the interval of the charge current intermittently supplied as the potential difference (potential difference between the VB terminal and the VS terminal) measured by the potential difference measuring section 36 increases. This can reduce the useless charge current.

Eighth Embodiment

Figure 10:
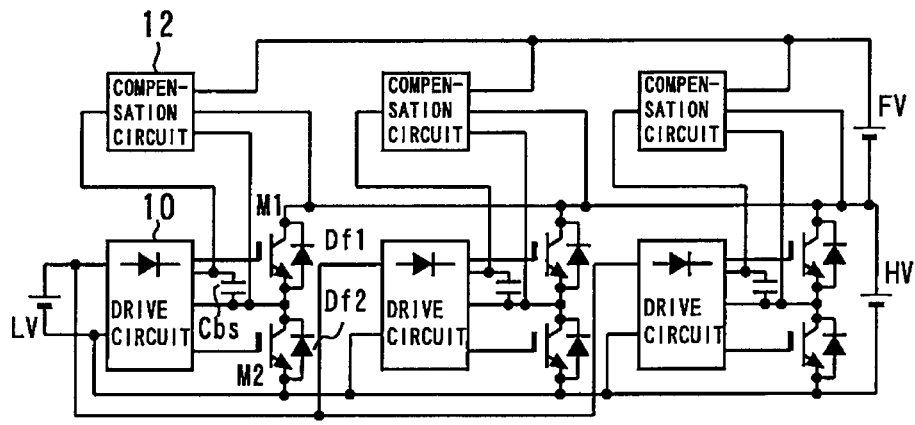
FIG. 10 is a circuit diagram illustrating a power semiconductor device according to an eighth embodiment.

FIG. 10 is a circuit diagram illustrating a power semiconductor device according to an eighth embodiment. The power semiconductor device is a three-phase full bridge inverter provided with three units, each of which is made up of the high side switching element M1, the low side switching element M2, the drive circuit 10, the bootstrap capacitor Cbs and the bootstrap compensation circuit 12. One floating power supply FV is shared by the three units. Although the bootstrap diode Dbs is incorporated in the drive circuit 10, the bootstrap diode Dbs may be provided externally.

Figure 11:
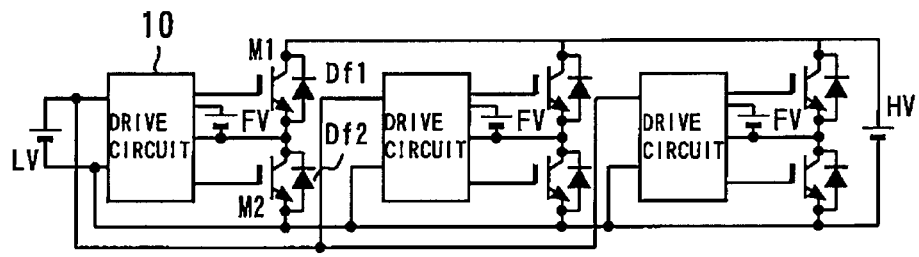
FIG. 11 is a circuit diagram illustrating a power semiconductor device according to a comparative example.

Effects of the present embodiment will be described in comparison with comparative examples. FIG. 11 is a circuit diagram illustrating a power semiconductor device according to a comparative example. In the comparative example, no bootstrap compensation circuit 12 is provided, but a floating power supply FV is provided in each unit to supply a drive voltage to the high side drive circuit 10a of the drive circuit 10. Therefore, three floating power supplies FV are necessary. On the other hand, the present embodiment can be implemented with a single power supply using the bootstrap compensation circuit 12.

Furthermore, in the case of the comparative example, dV/dt noise caused by a fluctuation in the VS potential accompanying ON/OFF of the switching element propagates to the high voltage side of the floating power supply FV. On the other hand, since the floating power supply FV of the present embodiment uses the high voltage side potential of the main power supply HV, which is a fixed potential, as a reference potential, the floating power supply FV is never affected by switching noise.

Figure 12:
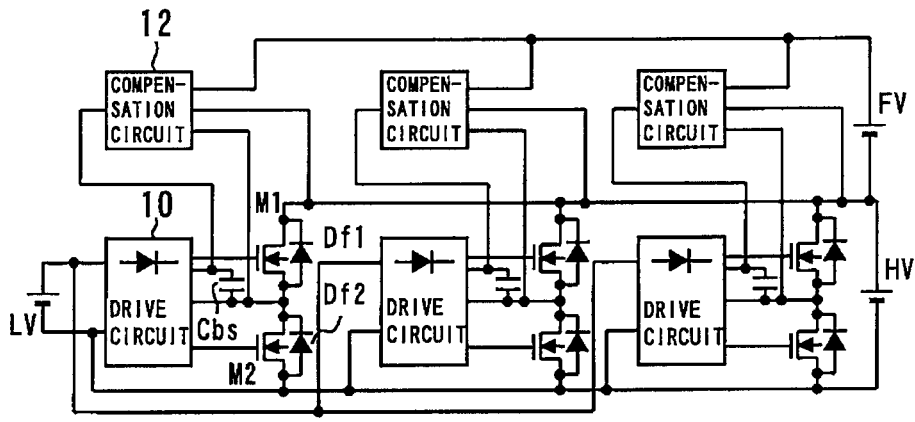
FIG. 12 is a circuit diagram illustrating another modification example of the power semiconductor device according to the eighth embodiment.

FIG. 12 is a circuit diagram illustrating another modification example of the power semiconductor device according to the eighth embodiment. The circuit changes the high side switching element M1 and the low side switching element M2 of the circuit in FIG. 10 from IGBTs to SiC MOSFETs (SiC devices) and replaces the reflux diodes Df1 and Df2 by SiC devices.

Adopting the SiC MOSFETs for the high side switching element M1 and the low side switching element M2 reduces power loss, and can thereby improve efficiency and characteristics of the apparatus. Furthermore, replacing the reflux diodes Df1 and Df2 by the SiC devices improves heat radiation properties and heat-resistance, and can thereby simplify the heat radiation section. To be more specific, it is possible to realize downsizing of the heat sink radiator fin and high efficiency of the water cooling section. Thus, the apparatus can be downsized.

Although the present embodiment adopts the configuration of the first embodiment for the drive circuit 10 and the bootstrap compensation circuit 12, the present invention is not limited to this, but can adopt the configuration of any one of the second to seventh embodiments. Moreover, the number of units is not limited to three, but can be four or more.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-099788, filed on Apr. 23, 2010 including specification, claims, drawings and summary, on which the Convention priority of the present application is based, are incorporated herein by reference in its entirety.

What is claimed is:

1. A power semiconductor device comprising:
a high side switching element and a low side switching element which are totem-pole-connected in that order from the high voltage side between a high voltage side potential and a low voltage side potential;
a high side drive circuit that drives the high side switching element;
a low side drive circuit that drives the low side switching element;
a bootstrap capacitor having first and second terminals and configured to supply a drive voltage to the high side drive circuit, the first terminal connected to a connection point between the high side switching element and the low side switching element, the second terminal connected to a power supply terminal of the high side drive circuit;
a bootstrap diode having an anode connected to a power supply and a cathode connected to the second terminal of the bootstrap capacitor and configured to supply a current from the power supply to the second terminal of the bootstrap capacitor;
a floating power supply having a reference potential connected to the high voltage side potential;
a bootstrap compensation circuit configured to supply a current from the floating power supply to the second terminal of the bootstrap capacitor, when the high side drive circuit turns ON the high side switching element and the low side drive circuit turns OFF the low side switching element; and
a current measuring section configured to measure a current that flows from the power supply to the second terminal of the bootstrap capacitor through the bootstrap diode,
wherein the bootstrap compensation circuit is further configured to supply the current from the floating power supply to the second terminal of the bootstrap capacitor, when the current measured by the current measuring section is smaller than a predetermined value.

2. A power semiconductor device comprising:
a high side switching element and a low side switching element which are totem-pole-connected in that order from the high voltage side between a high voltage side potential and a low voltage side potential;
a high side drive circuit that drives the high side switching element;
a low side drive circuit that drives the low side switching element;
a bootstrap capacitor having first and second terminals and configured to supply a drive voltage to the high side drive circuit, the first terminal connected to a connection point between the high side switching element and the low side switching element, the second terminal connected to a power supply terminal of the high side drive circuit;
a floating power supply configured to use the high voltage side potential as a reference potential; and
a bootstrap compensation circuit configured to supply a current from the floating power supply to the second terminal of the bootstrap capacitor,
wherein the bootstrap compensation circuit is further configured to continuously supply the current from the floating power supply to the second terminal of the bootstrap capacitor, when the high side drive circuit turns ON the high side switching element and the low side drive circuit turns OFF the low side switching element, and
the bootstrap compensation circuit is further configured to intermittently supply the current from the floating power supply to the second terminal of the bootstrap capacitor, when the high side drive circuit turns OFF the high side switching element and the low side drive circuit turns ON the low side switching element.

3. The power semiconductor device according to claim 2, further comprising a potential difference measuring section configured to measure a potential difference at both ends of the bootstrap capacitor,
wherein the bootstrap compensation circuit increases an interval of the current intermittently supplied as the potential difference measured by the potential difference measuring section increases.

4. The power semiconductor device according to claim 2, wherein the high side switching element and the low side switching element are SiC devices.

5. The power semiconductor device according to claim 2, further comprising reflux diodes which are anti-parallel connected to the high side switching element and the low side switching element respectively,
wherein the reflux diodes are SiC devices.

6. A power semiconductor device comprising a plurality of units configured to share a floating power supply,
wherein each unit includes:
a high side switching element and a low side switching element which are totem-pole-connected in that order from the high voltage side between a high voltage side potential and a low voltage side potential;
a high side drive circuit that drives the high side switching element;
a low side drive circuit that drives the low side switching element;
a bootstrap capacitor having first and second terminals and configured to supply—a drive voltage to the high side drive circuit, the first terminal connected to a connection point between the high side switching element and the low side switching element, the second terminal connected to a power supply terminal of the high side drive circuit;
a bootstrap diode having an anode connected to a power supply and a cathode connected to the second terminal of the bootstrap capacitor and configured to supply a current from the power supply to the second terminal of the bootstrap capacitor; and
a bootstrap compensation circuit configured to supply a current from the shared floating power supply to the second terminal of the bootstrap capacitor,
wherein the bootstrap compensation circuit is further configured to continuously supply the current from the floating power supply to the second terminal of the bootstrap capacitor, when the high side drive circuit turns ON the high side switching element and the low side drive circuit turns OFF the low side switching element, and
the bootstrap compensation circuit is further configured to intermittently supply the current from the floating power supply to the second terminal of the bootstrap capacitor, when the high side drive circuit turns OFF the high side switching element and the low side drive circuit turns ON the low side switching element, and the shared floating power supply is configured to use the high voltage side potential as a reference potential.

7. A power semiconductor device comprising a plurality of units configured to share a floating power supply, wherein each unit includes:
- a high side switching element and a low side switching element which are totem-pole-connected in that order from the high voltage side between a high voltage side potential and a low voltage side potential;
- a high side drive circuit that drives the high side switching element;
- a low side drive circuit that drives the low side switching element;
- a bootstrap capacitor having first and second terminals and configured to supply—a drive voltage to the high side drive circuit, the first terminal connected to a connection point between the high side switching element and the low side switching element, the second terminal connected to a power supply terminal of the high side drive circuit; and
- a bootstrap compensation circuit configured to supply a current from the shared floating power supply to the second terminal of the bootstrap capacitor, wherein the bootstrap compensation circuit is further configured to continuously supply the current from the floating power supply to the second terminal of the bootstrap capacitor, when the high side drive circuit turns ON the high side switching element and the low side drive circuit turns OFF the low side switching element, and the bootstrap compensation circuit is further configured to intermittently supply the current from the floating power supply to the second terminal of the bootstrap capacitor, when the high side drive circuit turns OFF the high side switching element and the low side drive circuit turns ON the low side switching element, and the shared floating power supply is configured to use the high voltage side potential as a reference potential.

* * * * *